United States Patent
Uzoh et al.

(10) Patent No.: US 6,465,376 B2
(45) Date of Patent: *Oct. 15, 2002

(54) METHOD AND STRUCTURE FOR IMPROVING ELECTROMIGRATION OF CHIP INTERCONNECTS

(75) Inventors: Cyprian Emeka Uzoh, Milpitas, CA (US); Daniel C. Edelstein, New Rochelle; Andrew Simon, Fishkill, both of NY (US)

(73) Assignee: International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/377,337

(22) Filed: Aug. 18, 1999

(65) Prior Publication Data

US 2002/0047208 A1 Apr. 25, 2002

(51) Int. Cl.⁷ .......................................... H01L 21/4763
(52) U.S. Cl. .................... 438/927; 438/626; 438/627; 438/643; 438/645; 438/665
(58) Field of Search ............... 438/688, 687, 438/626, 627, 643, 645, 648, 927, 663, 665

(56) References Cited

U.S. PATENT DOCUMENTS

| | | | |
|---|---|---|---|
| 4,680,854 A | 7/1987 | Ho et al. ................... 29/576 B |
| 4,962,060 A | 10/1990 | Sliwa et al. ................ 437/192 |
| 5,018,001 A | 5/1991 | Kondo et al. ................ 357/67 |
| 5,084,412 A | 1/1992 | Nakasaki ..................... 437/189 |
| 5,262,354 A | * 11/1993 | Cote et al. ..................... 216/18 |
| 5,290,733 A | 3/1994 | Hayasaka et al. ........... 437/194 |
| 5,300,307 A | 4/1994 | Frear et al. ................... 427/96 |
| 5,371,042 A | 12/1994 | Ong ............................. 437/194 |
| 5,470,788 A | 11/1995 | Biery et al. ................. 437/190 |
| 5,755,859 A | 5/1998 | Brusic et al. ............... 106/1.22 |
| 5,793,272 A | 8/1998 | Burghartz et al. .......... 336/200 |
| 5,807,165 A | 9/1998 | Uzoh et al. .................... 451/41 |
| 5,963,835 A | * 10/1999 | Sandhu et al. .............. 438/681 |
| 5,969,422 A | * 10/1999 | Ting et al. ................... 257/762 |
| 6,043,153 A | * 3/2000 | Nogami et al. ............. 438/687 |
| 6,103,624 A | * 8/2000 | Nogami et al. ............. 438/687 |

FOREIGN PATENT DOCUMENTS

| | | |
|---|---|---|
| JP | 62-234343 | 10/1987 |
| JP | 62-234345 | 10/1987 |
| JP | 62-234346 | 10/1987 |
| JP | 62240733 A | 10/1987 |
| JP | 62240734 A | 10/1987 |
| JP | 62240735 A | 10/1987 |
| JP | 62240736 A | 10/1987 |
| JP | 62240737 A | 10/1987 |
| JP | 62240738 A | 10/1987 |
| JP | 62240739 A | 10/1987 |

OTHER PUBLICATIONS

Revitz et al, "Electromigration Resistance for Ta Au Ta Metallurgy", IBM TDB, Feb. 1973, p. 2930.
Colgan et al, IBM TDB, No. 5, Oct. 1990, p. 134.
Gupta et al, "Utilization of Copper Transition Alloys in Integrated Circuits", IBM TDB, No. 7, Dec. 1992, pp. 133–134.

* cited by examiner

*Primary Examiner*—Carl Whitehead, Jr.
*Assistant Examiner*—Christy Novacek
(74) *Attorney, Agent, or Firm*—Pollock, Vande Sande & Amernick RLLP; Joseph P. Abate

(57) ABSTRACT

A microstructure comprises a conductive layer of aluminum, copper or alloys thereof on a substrate wherein the layer comprises metal grains at least about 0.1 microns and barrier material deposited in the grainboundaries of the surface of the metal is provided along with a method for its fabrication.

17 Claims, 4 Drawing Sheets

METHOD AND STRUCTURE FOR IMPROVING ELECTROMIGRATION OF CHIP INTERCONNECTS

DESCRIPTION OF TECHNICAL FIELD

The present invention relates to metal interconnects and more particularly metal interconnects having improved electromigration properties. The present invention also relates to a process for achieving improved electromigration.

BACKGROUND OF THE INVENTION

On VLSI and ULSI semiconductor chips, Al and alloys of Al are used for conventional chip wiring material. More recently Cu and alloys of Cu has been suggested as a chip wiring material. The use of Cu and Cu alloys results in improved chip performance and superior reliability when compared to Al and alloys of Al.

However, the reliability of aluminum-based and copper-based interconnections in electronic circuits is generally limited to a phenomenon known as electromigration. As microelectronic circuits are made more dense in order to improve performance, the electric fields (and resulting current densities) in the aluminum and copper interconnectors increase. Hence, as circuit densities increase, the rate of electromigration also increases.

Electromigration leads to circuit failure primarily via two mechanisms. In the first aluminum or copper electromigrates away from a region in the interconnector faster than the availability of additional atoms can take its place. This process generates a void in the interconnection. Growth of this void increases the electrical resistance of the interconnection to a point where circuit failure occurs. The second means by which electromigration failure occurs is when metal electromigrates into a region faster than it escapes the region, thus locally piling up metal atoms (called extrusions) to a point where it extends to the adjacent interconnection line, thereby causing an electrical short circuit.

The microstructure, especially of pure copper and aluminum is unstable after deposition onto a substrate. Upon annealing at elevated temperature, massive atomic mobility at the surface of the metals, especially copper, results in grainboundary grooving. In extreme cases, local separation between two adjacent grains may be larger than 4 nanometers. This local separation enhances grain decohesion during electromigration testing.

The problem of electromigration has been approached in a number of ways, the two most common are: (1) introducing a second species into the parent metal, e.g., alloying aluminum with a 0.2% to 4% copper, and (2) utilizing a redundant metal layer, e.g., titanium, tungsten or chromium layer(s) under and/or over the aluminum or copper lines.

While the above methods increase electromigration lifetime, there still remains room for improvement.

SUMMARY OF THE INVENTION

The present invention provides a method and structure that improves the electromigration of the metal interconnect. Moreover, the present invention provides a method and structure that addresses the problem of grainboundary grooving.

In particular, the method of the present invention comprises depositing a conductive layer of aluminum, copper or alloys thereof on a substrate, and thermally annealing the conductive layer at a temperature of about 250 to about 400° C. forming grainboundaries in the conductive layer. A barrier material is then deposited in the grainboundaries.

The present invention also relates to a microstructure obtained by the above process.

Another aspect of the present invention is concerned with a microstructure that comprises a conductive layer of aluminum, copper or alloys thereof on a substrate wherein the layer comprises metal grains of at least about 0.1 microns and barrier material deposited in the grainboundaries at the surface of the metal.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the description is to be regarded as illustrate in nature and not as restrictive.

DESCRIPTION OF THE DRAWINGS

The foregoing and other objects, aspects, and advantages of the present invention will be better understood from the following detailed description of a preferred embodiment of the invention with reference to the drawings, in which.

DETAILED DESCRIPTION OF THE INVENTION

Figure 1:
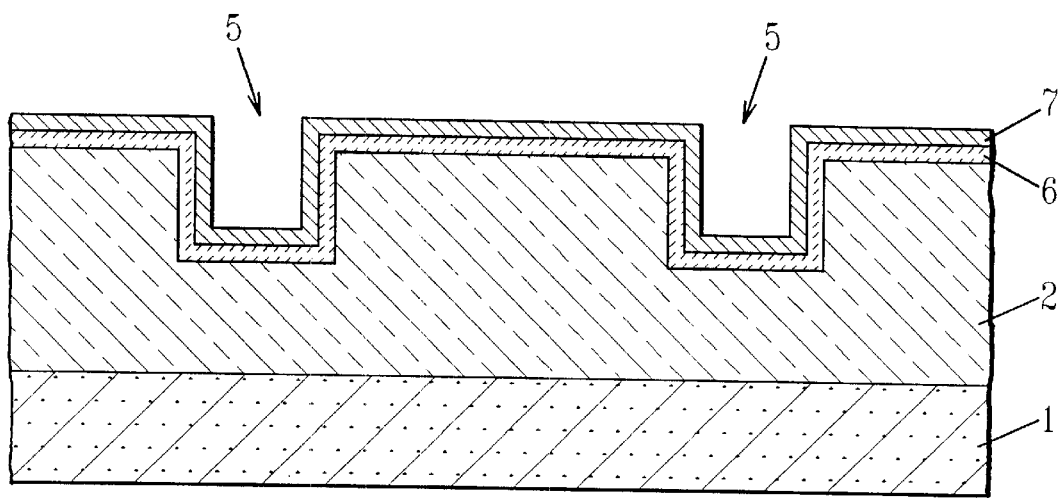
FIGS. 1–6 are schematic diagrams of a structure in accordance with the present invention in various stages of the processing according to an embodiment of the present invention.
Figure 2:
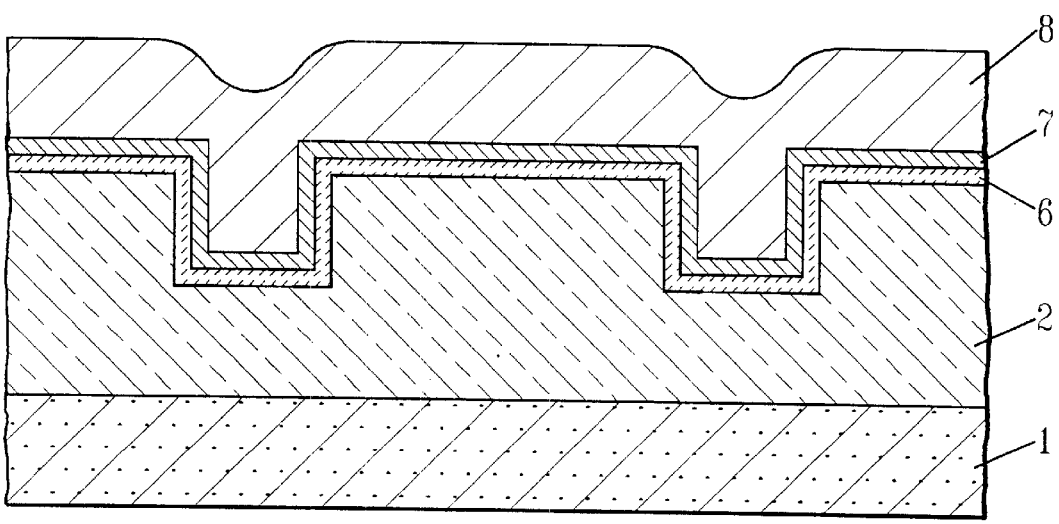

In order to facilitate an understanding of the present invention, reference will be made to the figures which illustrate a diagrammatic representation of the steps of an embodiment according to the present invention.

Referring now to the drawings, wherein like reference numerals represent the same or similar parts throughout, and more particularly, to layers 1 and 2 in all drawings, they respectively represent conventional substrate and passivating layers. To those skilled in the art, it should be apparent that the substrate could be a semiconductor wafer, wherein a plurality of devices (not shown) have been formed by conventional methods or, a substrate made of ceramic or organic material with or without interlayers of wiring channels. Likewise, the passivation layer could include inorganic or organic components or a combination thereof.

Referring to FIG. 1, a passivation layer 2 of $SiO_2$ is deposited over the surface of substrate 1. Trench 5 corresponds to an interconnection line pattern defined in a single or multi-layer structure of photoresist on top of the passivation layer 2. It is formed by reactively ion etching (RIE) the passivation layer 2 to a depth dictated by the required interconnection line thickness. While only one trench 5 is shown, it should be understood that more than one trench can be defined.

The next step of the process is to provide in the trench (or trenches) a diffusion barrier 6 made of tungsten or any other similar refractory metal, such as molybdenum, tantalum, titanium, chromium, chromium/chromium oxide or any combination thereof as shown in FIG. 1. This can be accomplished by first depositing a tungsten layer by CVD (Chemical Vapor Deposition) technique and removing excess tungsten by chemical-mechanical polishing.

If desired, a metal seed layer 7 may be applied to facilitate subsequent deposition of interconnect metal 8 such as copper, aluminum or alloys thereof. Suitable seed layers include tin/palladium.

A layer 8 of the interconnect metal such as copper, aluminum or alloys thereof and preferably copper is deposited such as by electroplating, sputtering, physical vapor deposition (PVD) or chemical vapor deposition. Preferably the metal is deposited by electroplating.

Figure 3:
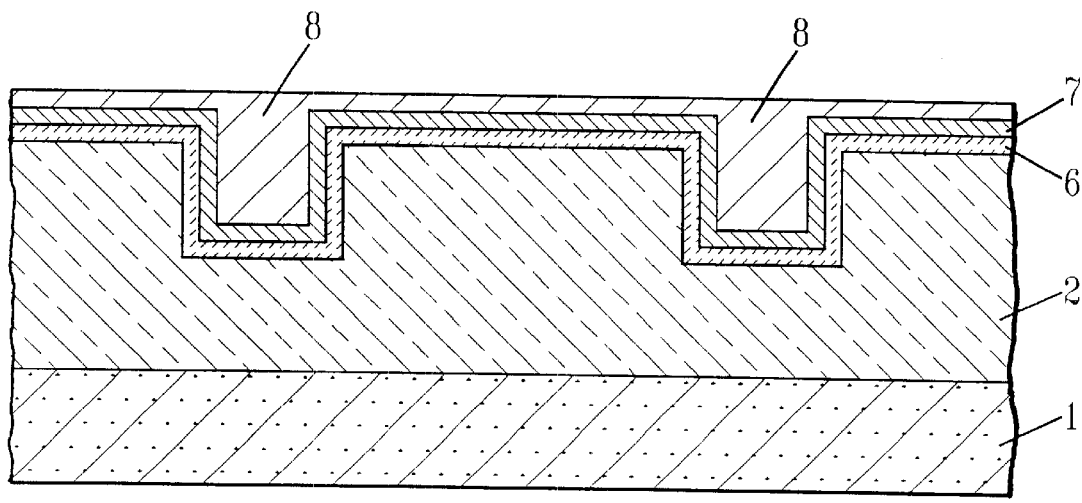

As shown in FIG. 3, preferably the metal layer 8 overburden is polished to some intermediate step, such as stopping on the barrier layer 6. The polishing can be carried out by employing chemical mechanical polishing. The polishing at this stage, and prior to the subsequent anneal is preferred since it helps to reduce the problem of grain grooving. The polishing prior to annealing prevents possible cracking in the barrier layer 6. The barrier layer 6 would typically tend to crack when annealing takes place with a thicker metal overburden.

Figure 4:
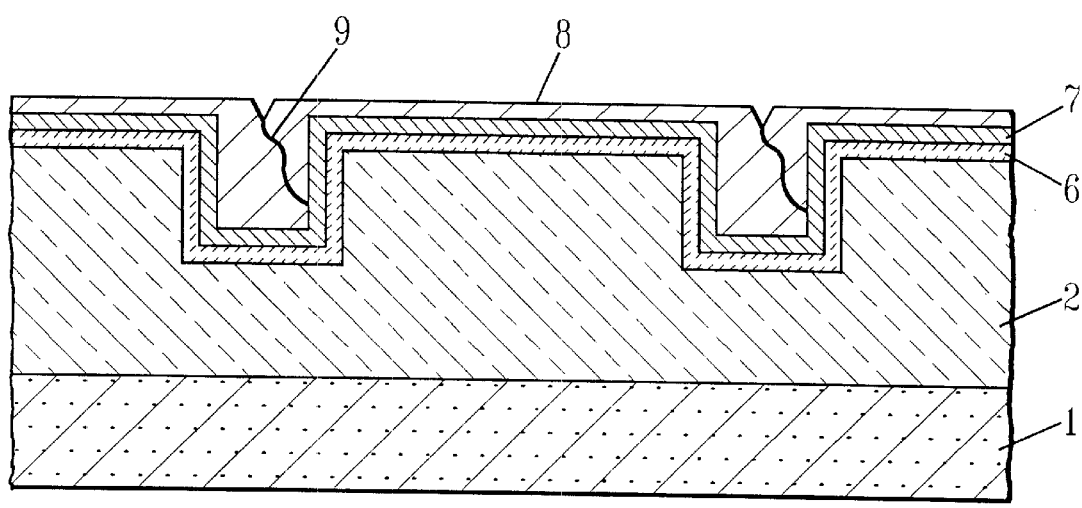

As illustrated in FIG. 4, grain growth and grainboundary grooving 9 is induced by annealing at a temperature of about 100° C. to about 450° C. and preferably about 250° C. to about 400° C. The annealing is typically carried out for about 10 to several hours and more typically for about 15 to about 90 minutes. The anneal is typically carried out in an atmosphere of an inert gas such as argon, helium, or nitrogen or under vacuum ambient or in a reducing ambient such as $H_2$ or forming gas ($N_2+H_2$). The pressure during the anneal is typically about 10 mTorr to atmosphere.

The preferred ambient is the reducing ambient (e.g. forming gas), since this combats the ability of unintentional oxygen presence from oxidizing the metal interconnects, which would tend to ruin them. This reducing ambient will also reduce (eliminate by decomposition) any copper oxides at even moderate temperatures, such as 300–400° C. Moreover, to reveal the grain boundary grooves in copper for the present invention, a reducing ambient is preferred, as it has been found to scrub or open the grain boundaries in the plated copper, presumably by volatilizing impurities such as O, N, C, S which are present in plated copper, and believed to segregate along the grain boundaries. This grain boundary scrubbing effect will maximize the filling by the second blocking metal in the present invention.

Figure 5:
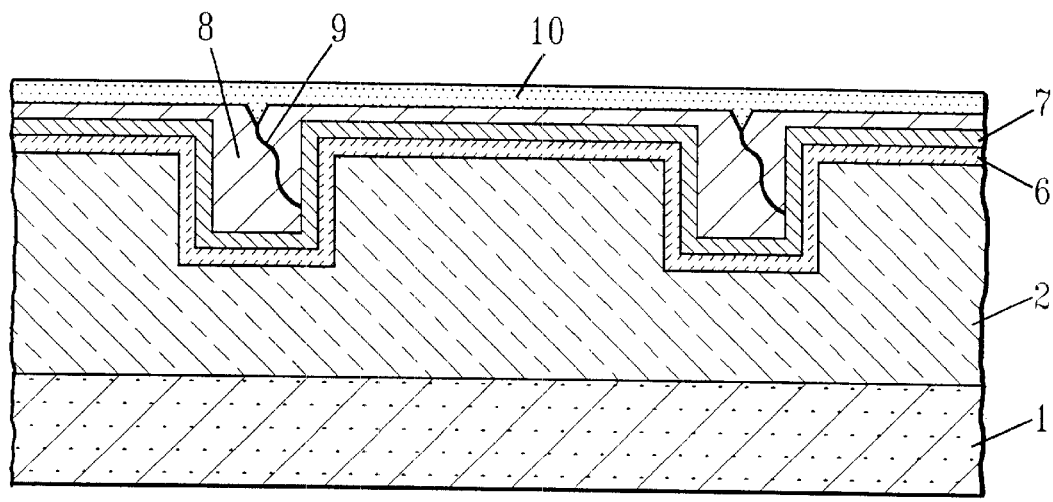

As shown in FIG. 5, the grooved grainboundaries 9 are plugged by depositing a barrier layer 10 such as alpha-tantalum, tantalum, tantalum nitride, tungsten, titanium, chromium, tin or indium or nitrides thereof. The layer 10 can be deposited for example by sputtering. Also, if desired to facilitate the deposit a seed layer of tin can be electrically deposited.

Figure 6:
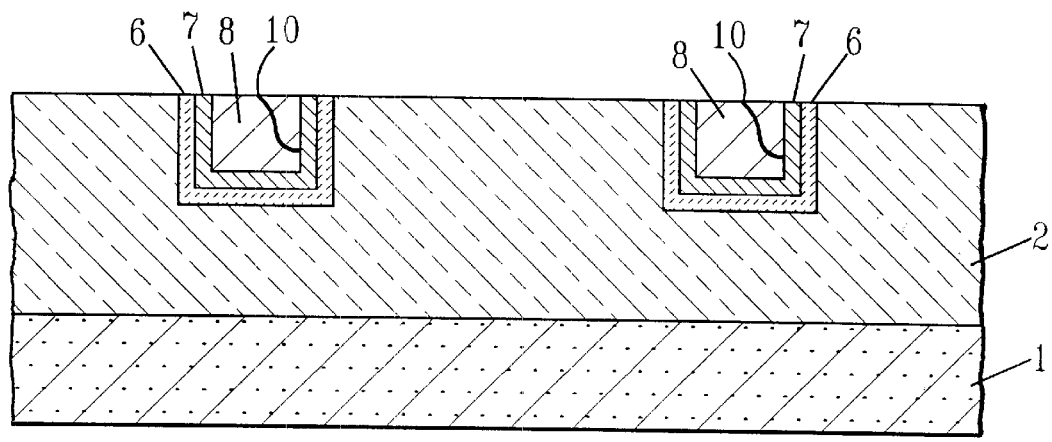

As shown in FIG. 6, the barrier film 10 is then planarized such as by chemical mechanical polishing (CMP) to electrically isolate the various metal features in the dielectric 2. The CMP typically employs a relatively hard polishing pad and polish slurry having minimal copper removal rate relative to the grain boundary-filling metal. Both of these features insure minimal dishing or erosion of the existing copper interconnects.

Figure 7:
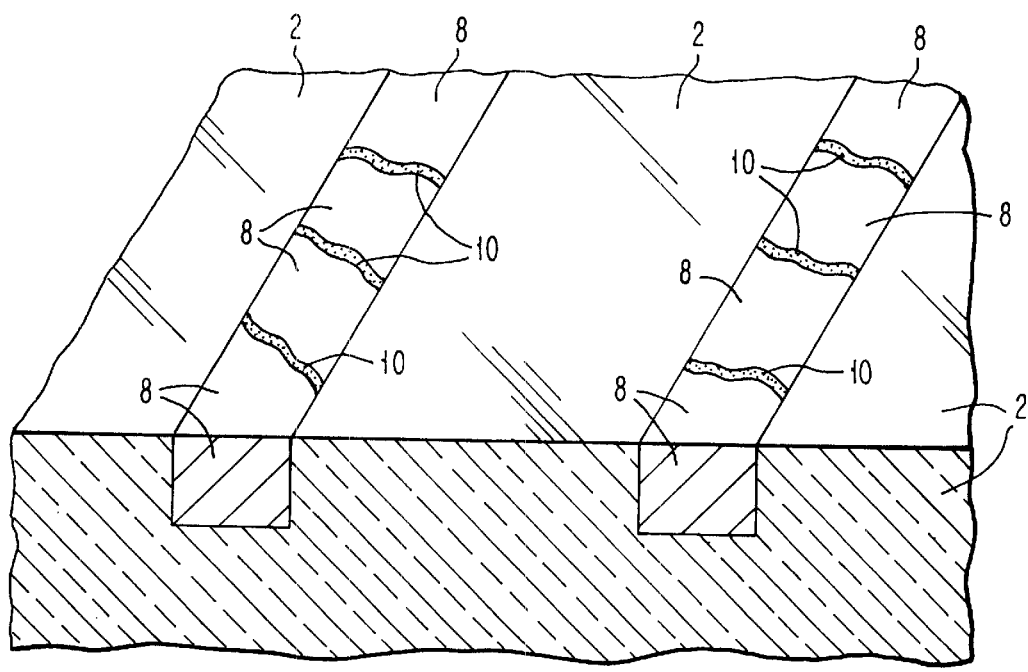
FIG. 7 is an isometric view illustrating the final metal microstructure at the metal surface according to the present invention.

FIG. 7 illustrates the final metal microstructure at the metal surface according to the present invention.

The final metal microstructure includes large copper grains with stuffed grainboundaries at the metal surface. The average size of the grains is typically at least about 0.1 microns. The grain size and grain size distribution depends somewhat upon the deposition method. For instance, with respect to an aluminum damascene structure, a warm or hot reflow step is generally used, which serves to grow the grains. Large grains are always preferably to small grains, as grain boundaries present a fast-diffusion path for electromigration or stress migration (both are interconnect wear out mechanisms). Therefore, larger grained damascene interconnects have higher reliability when all other factors are equal. A typical average aluminum grain size (for fill in submicron trenches) is on order of 0.5 micron, in a lognormal distribution.

For electroplated copper, a phenomenon of room temperature (or mild anneal temperature) annealing of as-deposited, pre-CMP polished copper can grow the grains from the approximately 0.1–0.3 micron initial size to 10 times this, i.e. about 1 to about 3 microns in size, and more typically about 0.8 micron to about 2 microns despite the limitations of the submicron interconnect trench sidewalls. This is a form of abnormal grain growth. The distribution is often not lognormal, sometimes bimodal, in part due to the high propensity for twinning in Cu during abnormal grain growth. This "recrystallized" copper is the preferred method for copper fill—to allow for this annealing prior to CMP, rather than to lock in small grains by performing CMP first (the annealing behavior is then not so pronounced, once the Cu overburden is removed).

The barrier layer 10 provides the advantage of plugging the ground boundary and all grainboundaries as well as some discontinuities on the surface of the interconnect lines.

The presence of the barrier metal 10 on the surface of the interconnect lines or vias also enhances adhesion of dielectric to the interconnect lines and especially to copper. A typical dielectric is silicon nitride which can subsequently be deposited.

In this disclosure, there are shown and described preferred embodiments of the invention but, as aforementioned, it is to be understood that the invention is capable of use in various other combinations and environments and is capable of changes or modifications within the scope of the inventive concept as expressed herein.

What is claimed is:

1. A method for fabricating a conductive layer of aluminum, copper or alloys thereof, which comprises:

depositing a diffusion barrier layer in trenches in a passivation layer; and depositing a conductive layer of aluminum, copper or alloy thereof into said trenches in a passivation layer;

polishing the conductive layer by chemical mechanical polishing;

thermally annealing the conductive layer at a temperature of about 100° C. to about 450° C. forming grainboundaries in the layer;

depositing a barrier material onto the conductive layer and into the grainboundaries, and then removing portions of the barrier material from the layer so that the barrier material is disposed solely within the grainboundaries.

2. The method of claim 1 wherein the conductive layer is aluminum or alloy thereof.

3. The method of claim 1 wherein the conductive layer is copper or alloy thereof.

4. The method of claim 1 wherein the conductive layer is copper.

5. The method of claim 1 wherein the annealing is carried out at a temperature of about 250° C. to about 400° C.

6. The method of claim 1 wherein the annealing is carried out for about 10 minutes to several hours.

7. The method of claim 1 wherein the annealing is carried out for about 15 to about 90 minutes.

8. The method of claim 1 wherein the barrier material is at least one material selected from the group consisting of alpha-tantalum, tantalum, tungsten, titanium, chromium, tin, indium, nitrides thereof and mixtures thereof.

9. The method of claim 1 wherein the barrier material is at least one material selected from the group consisting of alpha-tantalum, tantalum and nitrides thereof.

10. The method of claim 1 wherein grains having a size of at least about 0.1 microns are formed by the annealing.

11. The method of claim 10 wherein the size of the grains is about 0.3 to about 3 microns.

12. The method of claim 10 wherein the size of the grains is about 0.8 to about 2 microns.

13. The method of claim 1 wherein the passivation layer is silicon dioxide.

14. The method of claim 1 wherein the diffusion barrier layer is tungsten.

15. The method of claim 1 which further comprises depositing a seed layer after depositing the diffusion barrier layer and prior to depositing the conductive layer.

16. The method of claim 1 wherein the polishing stops on or near the diffusion barrier layer.

17. The method of claim 1 which comprises planarizing the barrier material.

* * * * *